(12) United States Patent
Vu et al.

(10) Patent No.: US 6,385,442 B1
(45) Date of Patent: *May 7, 2002

(54) MULTIPHASE RECEIVER AND OSCILLATOR

(75) Inventors: Hoai Xuan Vu; Toan Xuan Vu, both of Stanton, CA (US)

(73) Assignee: Symbol Technologies, Inc., Holtsville, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 26 days.

(21) Appl. No.: 09/034,826

(22) Filed: Mar. 4, 1998

(51) Int. Cl.[7] .............................. H04B 1/26; H04B 1/16; H03D 3/22
(52) U.S. Cl. .......................... 455/318; 455/205; 331/57; 331/45; 327/238; 375/332
(58) Field of Search ................................ 455/302, 303, 455/304, 366, 314, 315, 318, 323, 324, 404, 255, 256, 257, 258, 259, 260, 205; 331/57, 45; 375/324, 331, 332, 340, 349; 327/254, 238

(56) References Cited

U.S. PATENT DOCUMENTS

| | | | | |
|---|---|---|---|---|
| 3,783,397 A | * | 1/1974 | Dishal et al. | 327/47 |
| 4,565,976 A | * | 1/1986 | Campbell | 331/57 |
| 4,629,994 A | * | 12/1986 | Shimotashiro et al. | 329/327 |
| 4,688,264 A | * | 8/1987 | Miura | 455/168.1 |
| 4,955,078 A | * | 9/1990 | Chung | 455/244.1 |
| 4,988,960 A | * | 1/1991 | Tomisawa | 332/127 |
| 5,014,352 A | * | 5/1991 | Chung | 455/314 |
| 5,095,536 A | * | 3/1992 | Loper | 455/324 |
| 5,132,633 A | * | 7/1992 | Wong et al. | 327/113 |
| 5,212,825 A | * | 5/1993 | Layton | 455/205 |
| 5,262,735 A | * | 11/1993 | Hashimoto et al. | 331/45 |
| 5,382,921 A | * | 1/1995 | Estrada et al. | 331/1 A |
| 5,406,228 A | * | 4/1995 | Hoang | 331/1 A |
| 5,428,318 A | * | 6/1995 | Razavi | 331/57 |
| 5,483,695 A | * | 1/1996 | Pardoen | 455/314 |
| 5,485,490 A | * | 1/1996 | Leung et al. | 375/371 |
| 5,553,100 A | * | 9/1996 | Saban et al. | 375/340 |
| 5,594,392 A | * | 1/1997 | Kondoh et al. | 331/57 |
| 5,635,877 A | * | 6/1997 | Monk et al. | 331/57 |
| 5,666,088 A | * | 9/1997 | Penza | 331/34 |
| 5,691,669 A | * | 11/1997 | Tsai et al. | 331/17 |
| 5,757,864 A | * | 5/1998 | Petranovich et al. | 375/344 |
| 6,088,414 A | * | 7/2000 | Dove et al. | 375/376 |
| 6,181,213 B1 | * | 1/2001 | Chang | 331/34 |

FOREIGN PATENT DOCUMENTS

WO 01/28085 * 4/2001 ............ H03D/3/00

OTHER PUBLICATIONS

IEEE Journal of Solid State Circuits vol. 31, No. 3, Mar. 96 p. 331–343.
Proceedings of Conference on Radio Receivers and Associated Systems 1981, IERE No. 50, p. 49–59.

* cited by examiner

*Primary Examiner*—Vivian Chang
*Assistant Examiner*—Charles N. Appiah

(57) ABSTRACT

A differential ring oscillator is provided with three differential amplifiers and provides three-phase output signals which can be used for synchronous detection of a received multi-phase modulated signal in a multi-phase receiver, wherein the phase of the local oscillator signals may be in other-than-quadrature relation. Two of the phase outputs of the local oscillator can be combined to provide a signal that is in quadrature with the remaining output. The oscillator is preferably controlled in coarse frequency control steps and using a fine voltage control signal responsive to a phase-locked loop to reduce frequency modulation of the oscillator signal arising out of leakage signals.

23 Claims, 9 Drawing Sheets

MULTIPHASE RECEIVER AND OSCILLATOR

BACKGROUND OF INVENTION

The present invention relates to radio transmitters and receivers, and to oscillators for use therein. In particular, the present invention, in its various aspects, addresses problems that arise in connection with designing and fabricating radio circuits on integrated circuit chips, and particularly on CMOS integrated circuit chips.

FIG. 1 discloses a known technique for reception of Amplitude-Shift-Keyed (ASK) radio signals using a local oscillator having quadrature phase components, including systems for direct conversion to baseband. In the receiver 10, a modulated carrier signal, x(t), is provided on input line 12 to mixers 14 and 16. The mixers multiply the modulated carrier x(t) by two local oscillator signal components in phase quadrature, to thereby detect in-phase and quadrature-phase components of the received signal at the intermediate frequency (IF). The in-phase and quadrature-phase components of the received signal at IF are isolated from the mixers' (14 and 16) outputs by low-pass filters 18 and 20. The instantaneous signal energies of the in-phase and quadrature-phase components of the received signal at IF are detected by energy detectors 22 and 24. The detected in-phase and quadrature-phase instantaneous signal energy outputs are summed in combiner 26 to produce an output signal J representative of the instantaneous baseband signal energy, which is independent of the phase relation between the local oscillator and the transmitted carrier. In amplitude-shift-keying systems, the instantaneous baseband signal energy is also representative of the original baseband signal which modulates the transmitted carrier. Hence, the demodulation process is achieved.

One difficulty associated with using a detector having the arrangement of FIG. 1 is the requirement of providing local oscillator signal components having quadrature-phase relation.

FIG. 2 illustrates one possible arrangement for providing quadrature phase components of a local oscillator in an integrated circuit configuration. The oscillator 30 of FIG. 2 comprises a four-stage differential ring oscillator having differential amplifiers 32, 34, 36 and 38. The circuit of FIG. 2 oscillates with period equal to the total time delay of the four differential amplifiers. The time delay of each differential amplifier can be varied, thereby to change the frequency of oscillation, by providing a voltage control on lead 40 which changes the propagation delay through each of the differential amplifiers. Since the total phase delay around the loop in the differential ring oscillator 30 is 360°, quadrature local oscillator signal components can easily be obtained at the outputs of adjacent differential amplifiers, such as amplifiers 32, 34, as shown in FIG. 2.

The oscillator of FIG. 2 can be difficult to implement where the required oscillation frequency is relatively high, such as 2.4 GHz allocated to the unlicensed ISM (Industrial, Scientific and Medical) frequency band. In attempting to implement differential ring oscillator 30 using CMOS technology, it has been found that the maximum frequency available with four stages is about 1.9 GHZ. Differential ring oscillator 30 can be implemented with three differential amplifier stages, but such arrangement will not provide the quadrature or orthogonal phase local oscillator components required in the receiver 10 of FIG. 1.

FIG. 3 is a graph showing the relation of the control voltage V for the oscillator 30 to the operating frequency. Typically, small variations in the control voltage ΔV, can produce significant variations in the frequency of the oscillator output. Where the control voltage has a periodic component, as may arise by reason of leakage of a reference oscillator signal in a phase locked loop, the resulting variation in control voltage V will produce undesired FM sidebands in the output signal of oscillator 30.

FIG. 8 discloses a classic quadrature direct-conversion technique for reception of frequency modulated (FM) radio signals. In the receiver 120, a modulated carrier signal, x(t), is provided on input line 122 to mixers 124 and 126. The mixers multiply x(t) by two local oscillator signal components in phase quadrature, to thereby detect in-phase and quadrature-phase components of the received signal at the intermediate frequency (IF). The in-phase and quadrature-phase components of the received signal at IF are isolated from the mixers' (124 and 126) outputs by low-pass filters 128 and 130. The frequency modulation of the in-phase and quadrature-phase components of the received signal at IF are detected by differentiators 132 and 134. The detected in-phase and quadrature-phase frequency modulation outputs are multiplied in mixers 136 and 138 by the quadrature-phase and in-phase components, respectively, of the low-pass filtered received signal at IF and then are summed in combiner 140 to produce an output signal y(t) representative of the demodulated frequency deviation. The in-phase and quadrature-phase components of the received signal at IF are also each squared in detectors 142 and 144 and then summed in combiner 146 to produce an output signal J(t) representative of the instantaneous received signal energy, which is independent of the phase relation between the local oscillator and the transmitted carrier.

It is an object of the present invention to provide a radio frequency receiver which can be implemented in an integrated circuit without suffering from the disadvantages of the art.

It is a farther object of the invention to provide an integrated circuit oscillator having an improved suppression of undesired FM sidebands in the oscillator output.

SUMMARY OF THE INVENTION

In accordance with the invention, there is provided an amplitude-modulated signal receiver including a local oscillator providing at least three equally-phased local oscillator signal components. The local oscillator signal components are mixed with a modulated carrier signal and the resultants are provided to corresponding signal detectors. The output of the signal detectors are combined to provide a received signal, In accordance with the present invention the local oscillator may be implemented as a voltage-controlled oscillator in a phased-locked loop. The voltage-controlled oscillator has a frequency which is controlled by first and second current control devices, including coarse and fine current control devices. Preferably the coarse current control device is controlled by a signal which is selected in discrete steps, while the fine current control device is controlled by an analog signal.

The phase locked loop may include signal comparators for comparing a phase error signal to upper and lower values to implement adjustments of the coarse control signal in discrete steps. The phase error signal is used for controlling the fine current control device.

In accordance with the invention, there is also provided a frequency-modulated signal receiver including a local oscillator having at least three equally phased components. Each of the phase components of the local oscillator is mixed with the received signal and the outputs of all but one of the mixers are additively combined. A discriminator responsive to the outputs of the one uncombined mixer and the combiner provides an output signal representative of the demodulated frequency modulation. Preferably, the discriminator includes a first differentiator responsive to the one uncombined mixer output, a second differentiator responsive to the combiner output, a first mixer responsive to the first differentiator output and the combiner output, a second mixer responsive to the second differentiator output and the one uncombined mixer output and a second combiner for combining the outputs of the first and second mixers.

In accordance with the invention, there is also provided a receiver for receiving phase modulated signals including the frequency modulated signal receiver and a device for integrating the signal representative of frequency modulation to derive a signal representative of phase modulation.

Finally, in accordance with the invention, there is also provided a local oscillator which provides first and second local oscillator component signals in phase quadrature. The local oscillator includes an oscillator providing at least three equally-phased component signals and a combiner for combining all but one of the component signals such that the output of the combiner includes a local oscillator signal in phase quadrature with the one uncombined component signal.

For a better understanding of the present invention, together with other and further objects, reference is made to the following description, taken in conjunction with the accompanying drawings, and its scope will be pointed out in the appended claims.

DESCRIPTION OF THE INVENTION

Figure 1:
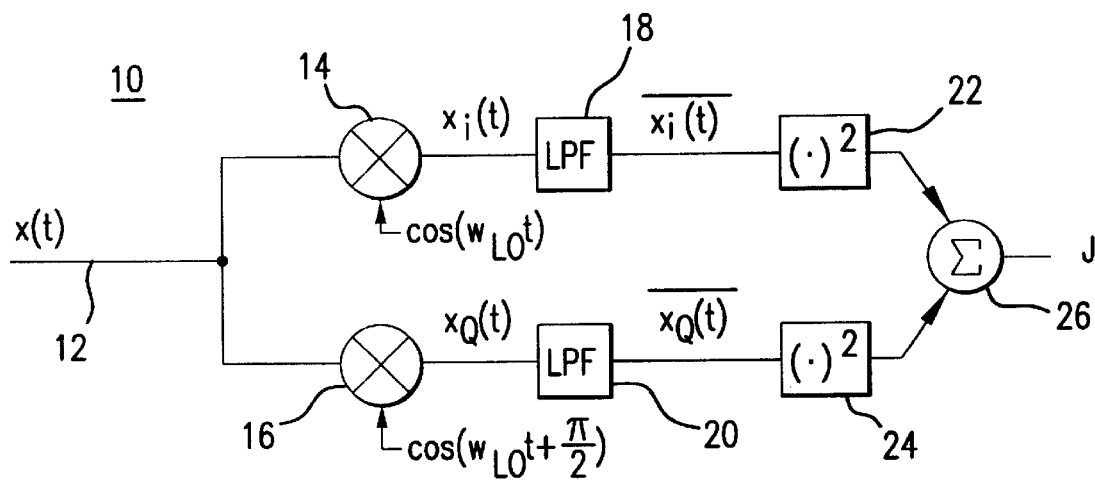
FIG. 1 is a block diagram showing a prior art orthogonal phase receiver.
Figure 2:
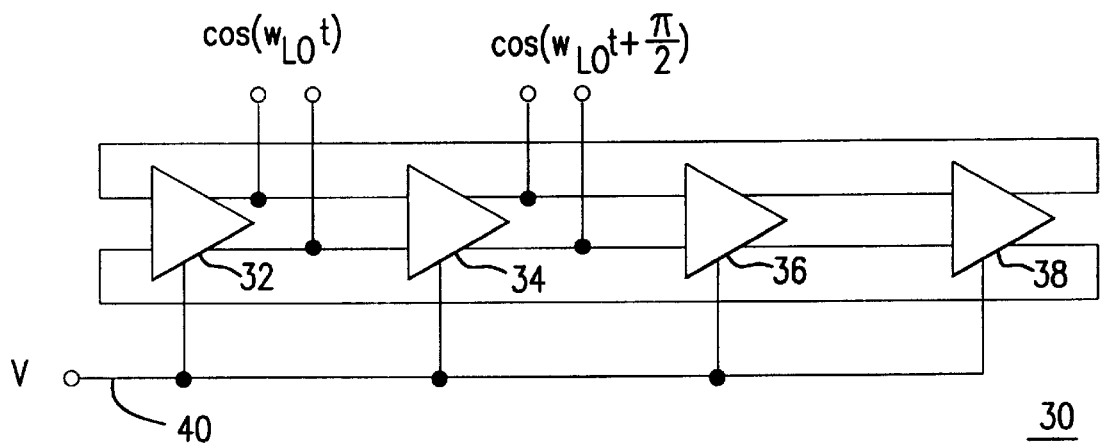
FIG. 2 is a schematic diagram showing a prior art differential ring oscillator.
Figure 4:
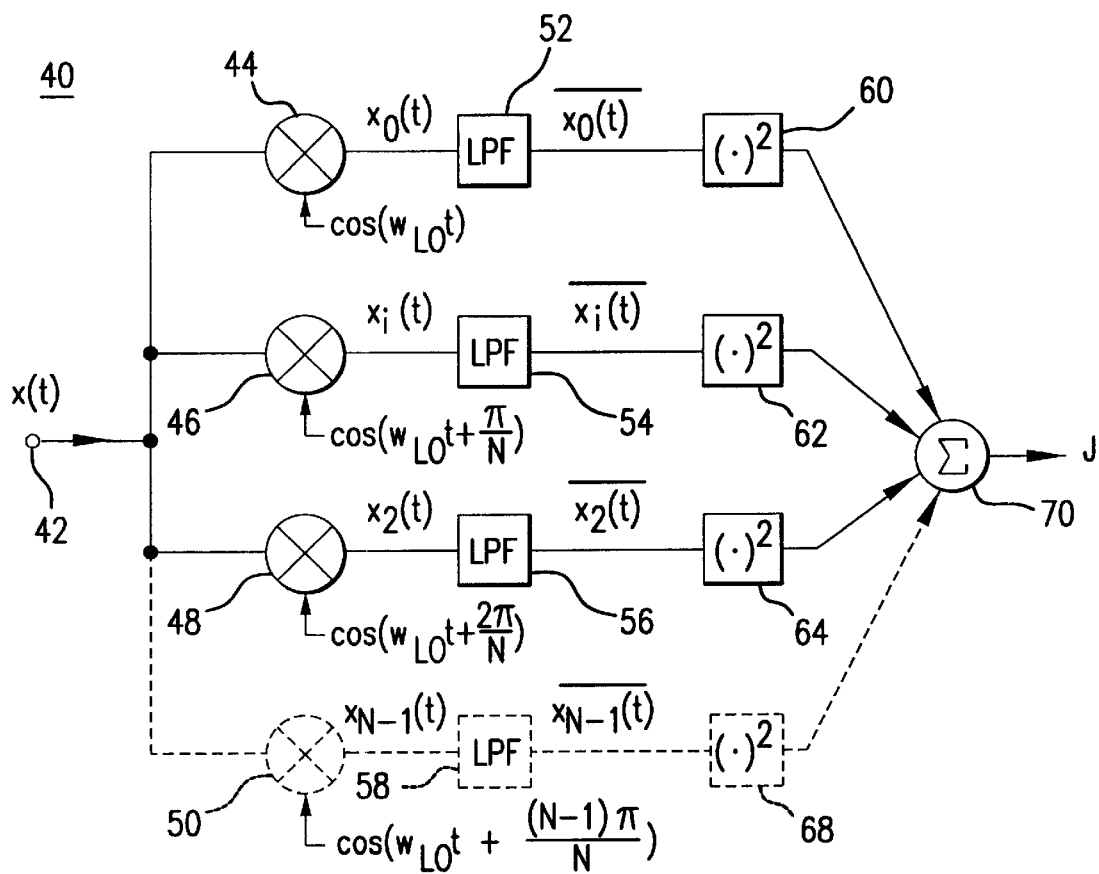
FIG. 4 is a block diagram showing the configuration of a multi-phase heterodyne amplitude-modulated signal receiver according to the present invention.

FIG. 4 is a block diagram depicting a multi-phase heterodyne receiver 40 for amplitude-modulated signals, such as amplitude-shift-keyed signals or pulse code modulated signals in accordance with the present invention. In contrast to the receiver 10 shown in FIG. 1, wherein the local oscillator is provided with two orthogonal, quadrature phase components to mixers 14 and 16, receiver 40 includes mixers receiving three or more equally-phased local oscillator signals. The equally phased local oscillator signals are equally separated in phase over a phase angle of 180° or, equivalently are the negative of signals so phased. Accordingly, where N=3, three local oscillator signal components are provided, with adjacent signal components separated in phase by $\pi/3$ radians or 60° or the phase inversions of such signals.

The multi-phase heterodyne receiver is general in the sense that any integral number of phases may be provided. The prior art receiver 10, where N=2, has thus-far been understood in connection with the recognition that local oscillator signals separated in phase by 90° are orthogonal. In a receiver having 3 or more equally phased local oscillator signal components as depicted in the FIG. 4 amplitude-modulated signal receiver, the components are not orthogonal, but it may be mathematically shown that the resulting combined signal from the multiphase receiver is proportional to the instantaneous baseband signal energy which is representative of the baseband signal which modulates the amplitude of the transmitted carrier, independent of input signal phase relative to the local oscillator, in the same way that an orthogonal quadrature receiver output is proportional to the instantaneous baseband signal energy.

As shown in FIG. 4, mixers 44, 46, 48 and 50 are provided with equally phased local oscillator signal components, and N such mixers are provided, with the phase between adjacent local oscillator components being separated by $\pi/N$ radians. The output signals from each of the mixers are provided to low pass filters 52, 54, 56, 58 and detectors 60, 62, 64, 68. The detected output signals are summed in combiner 70 to provide a received output signal which is representative of the instantaneous baseband signal energy. For amplitude-modulated systems, the instantaneous baseband signal energy is representative of the original baseband signal which modulates the transmitted carrier.

The input signal is defined generally by the following equation:

$$x(t) = f(t)\cos(w_c t + \phi) \quad (1)$$

For each of mixers 44, 46, 48 and 50 the mixer output is given by:

$$x_k(t) = f(t)\cos(w_C t + \phi)\cos\left(w_{LO} t + \frac{k}{N}\pi\right) \quad \text{Equation (2)}$$

$$x_k(t) = 1/2 f(t)\left\{\cos\left[w_{IF} t + \phi - \frac{k}{N}\pi\right] + \cos\left[(w_C + w_{LO})t + \phi + \frac{k}{N}\pi\right]\right\} \quad \text{Equation (3)}$$

The low frequency components of output signals from low-pass filters 52, 54, 56 and 58 are:

$$\bar{x}_k(t) = 1/2 f(t)\cos\left(w_{IF} t + \phi - \frac{k}{N}\pi\right) \quad \text{Equation (4)}$$

where $w_{IF} \triangleq w_C - w_{LO}$ $$\bar{x}_k(t) = 1/2 f(t)\cos\left(\alpha - \frac{k}{N}\pi\right) \quad \text{Equation (5)}$$

-continued where $\alpha \stackrel{\Delta}{=} w_{IF}t + \phi$

The instantaneous signal energy at the output of combiner 70 is:

$$J \stackrel{\Delta}{=} \sum_{k=0}^{N-1} \overline{x}_k^2(t) \qquad \text{Equation (6)}$$

$$= \sum_{k=0}^{N-1} 1/4 f^2(t) \cos^2\left(\alpha - \frac{k}{N}\pi\right)$$

$$= 1/4 f^2(t) \sum_{k=0}^{N-1} \left[\cos\left(\frac{k}{N}\pi\right)\cos\alpha + \sin\left(\frac{k}{N}\pi\right)\sin\alpha\right]^2$$

$$J = 1/4 f^2(t) \sum_{k=0}^{N-1} \left[\cos^2\left(\frac{k}{N}\pi\right)\cos^2\alpha + \right. \qquad \text{Equation (7)}$$

$$\left. \sin^2\left(\frac{k}{N}\pi\right)\sin^2\alpha + 1/2\sin\left(2\frac{k}{N}\pi\right)\sin 2\alpha\right]$$

Using the relationship:

$$1/2 \sum_{k=0}^{N-1} \left[\sin\left(2\frac{k}{N}\pi\right)\sin 2\alpha\right] = 1/2\sin 2\alpha \sum_{k=0}^{N-1} \sin\left(\frac{k}{N}2\pi\right) \qquad \text{Equation (8)}$$

$$= \frac{1}{4j}\sin 2\alpha \sum_{k=0}^{N-1} \left[e^{j\frac{k2\pi}{N}} - e^{-j\frac{k2\pi}{N}}\right]$$

$$= \frac{\sin 2\alpha}{4j}\left[\frac{1 - e^{j2\pi}}{1 - e^{j2\frac{\pi}{N}}} - \frac{1 - e^{-j2\pi}}{1 - e^{-j2\frac{\pi}{N}}}\right]$$

$$= 0$$

the energy is simplified to:

$$J = 1/4 f^2(t) \sum_{k=0}^{N-1} \left[\cos^2\left(\frac{k}{N}\pi\right)\cos^2\alpha + \sin^2\left(\frac{k}{N}\pi\right)\sin^2\alpha\right] \qquad \text{Equation (9)}$$

Applying trigonometry:

$$J = 1/4 f^2(t) \left\{ \sum_{k=0}^{N-1} \cos^2\left(\frac{k}{N}\pi\right) - \sin^2\alpha \sum_{k=0}^{N-1} \cos\left(\frac{k}{N}2\pi\right) \right\} \qquad \text{Equation (10)}$$

$$\sum_{k=0}^{N-1} \cos\left(\frac{k}{N}2\pi\right) = 1/2 \left[\sum_{k=0}^{N-1} e^{j\frac{k2\pi}{N}} + \sum_{k=0}^{N-1} e^{-j\frac{k2\pi}{N}}\right] = 0 \qquad \text{Equation (11)}$$

$$J = 1/4 f^2(t) \sum_{k=0}^{N-1} \cos^2\left(\frac{k}{N}\pi\right) \qquad \text{Equation (12)}$$

$$= 1/4 f^2(t) \sum_{k=0}^{N-1} \frac{1 + \cos\left(\frac{k}{N}2\pi\right)}{2}$$

$$J = 1/4 f^2(t) \left[\frac{N}{2} + \frac{1}{2}\sum_{k=0}^{N-1} \cos\left(\frac{k}{N}2\pi\right)\right] \qquad \text{Equation (13)}$$

Since:

$$\frac{1}{2}\sum_{k=0}^{N-1} \cos\left(\frac{k}{N}2\pi\right) = 0$$

from Equation 11, $$J = \frac{N}{2}[1/4 f^2(t)] \qquad \text{Equation (14)}$$

Accordingly, the energy recovered is equal to N/2 times the equivalent energy recovered in a quadrature heterodyne receiver, where N=2.

Figure 6:
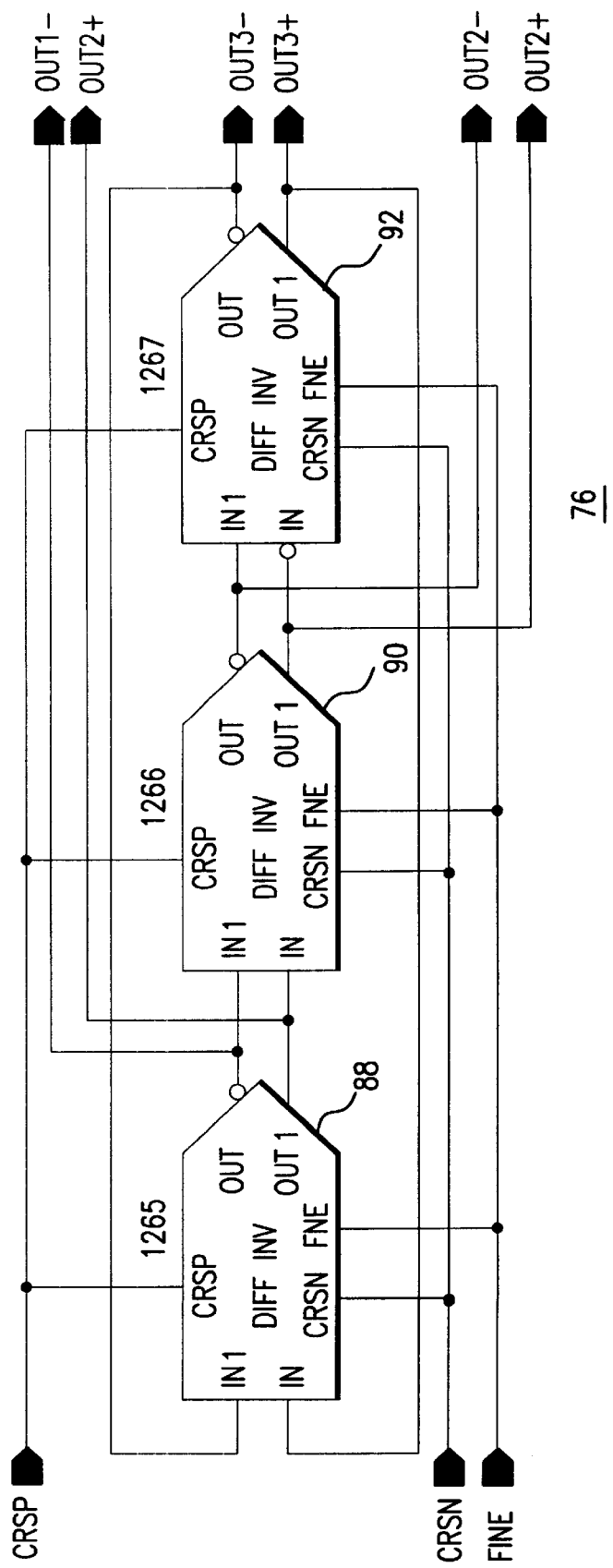
FIG. 6 is a schematic diagram of a differential ring oscillator used in the phase-locked loop of FIG. 5.

The primary reasons, as discussed above, for using more than two components of the local oscillator signal is the fact that on an integrated circuit, voltage-controlled oscillators can be conveniently implemented using ring oscillators, an example of which is the three-amplifier differential ring oscillator 76 as shown in FIG. 6. While oscillator 76 does not provide quadrature-phase signal components for use in receiver 10, it has natural outputs of three. equally-phased components which can be utilized for receiver 40. In the FIG. 6 embodiment, the differential ring oscillator includes amplifiers 88, 90 and 92, connected as illustrated.

In a preferred arrangement, the voltage-controlled oscillator 76 is phased locked to a reference signal, e.g. from a stable oscillator, such as a crystal oscillator, using a phase-locked loop. In order to overcome the potential FM sidebands, as described with respect to FIG. 3, that result from the sensitivity of the voltage-controlled oscillator to fluctuations in the phase-error signal caused by incomplete suppression of the reference signal by low-pass filter 74, shown in FIG. 5, the differential ring oscillator 76 of FIG. 6 includes provisions for coarse and fine frequency control signals. In particular, there are provided two coarse frequency control signals, CRSP and CRSN, which are signals with a DC characteristic, dynamically switched in discrete steps to coarsely tune the output frequency of the voltage-controlled oscillator 76 to within a narrow neighborhood of the intended steady-state value. In addition, there is provided a fine frequency control analog signal which tunes the output frequency of the voltage-controlled oscillator 76, within the narrow neighborhood set by the coarse frequency control signals, to the exact intended steady-state frequency at which the phase error signal is a constant and the frequency error is zero.

Figure 3:
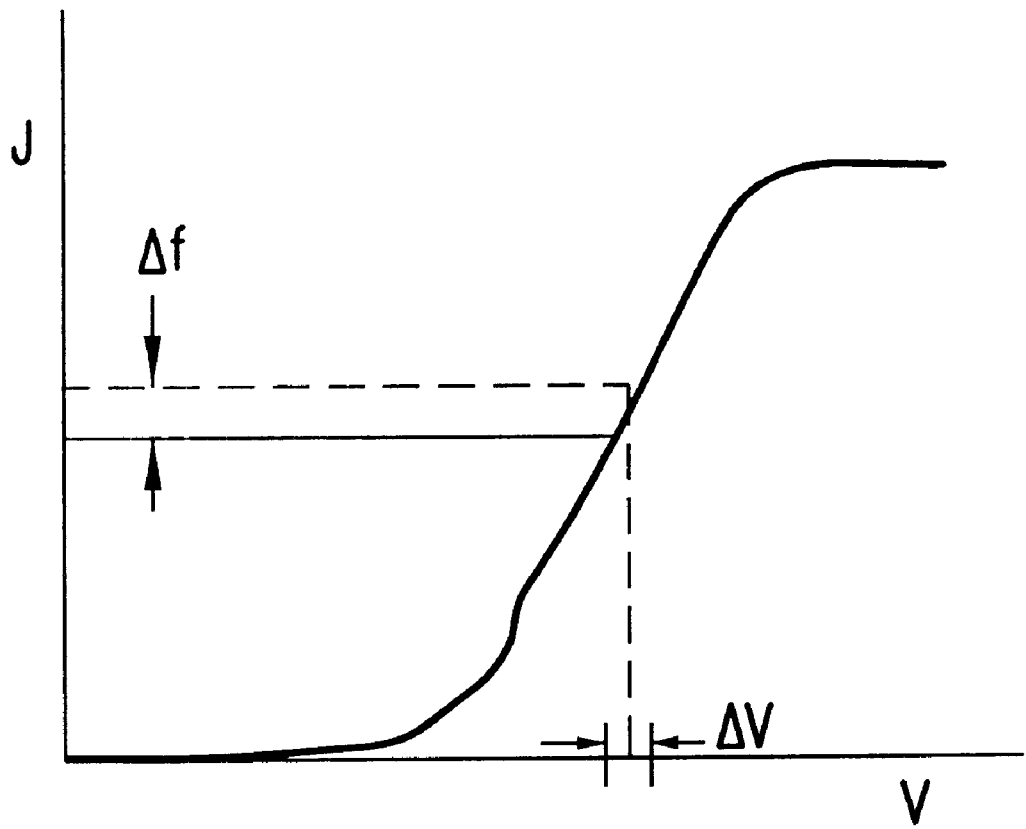
FIG. 3 is a graph showing the relation of frequency to control voltage for the oscillator of FIG. 2.

By using coarse and fine control signals, the arrangement of FIG. 6 can provide a lower amount of frequency variation and undesired FM sidebands in the RF output as compared to conventional oscillators which include only coarse analog control, wherein minor fluctuations in the control signal can result in significant FM modulation. The oscillator 76 is less sensitive to such fluctuations because the frequency changes resulting from voltage fluctuation in the fine control signal are less than they would be when the applied voltage control signal must cover the entire frequency range of the oscillator, as depicted in FIG. 3.

Figure 7:
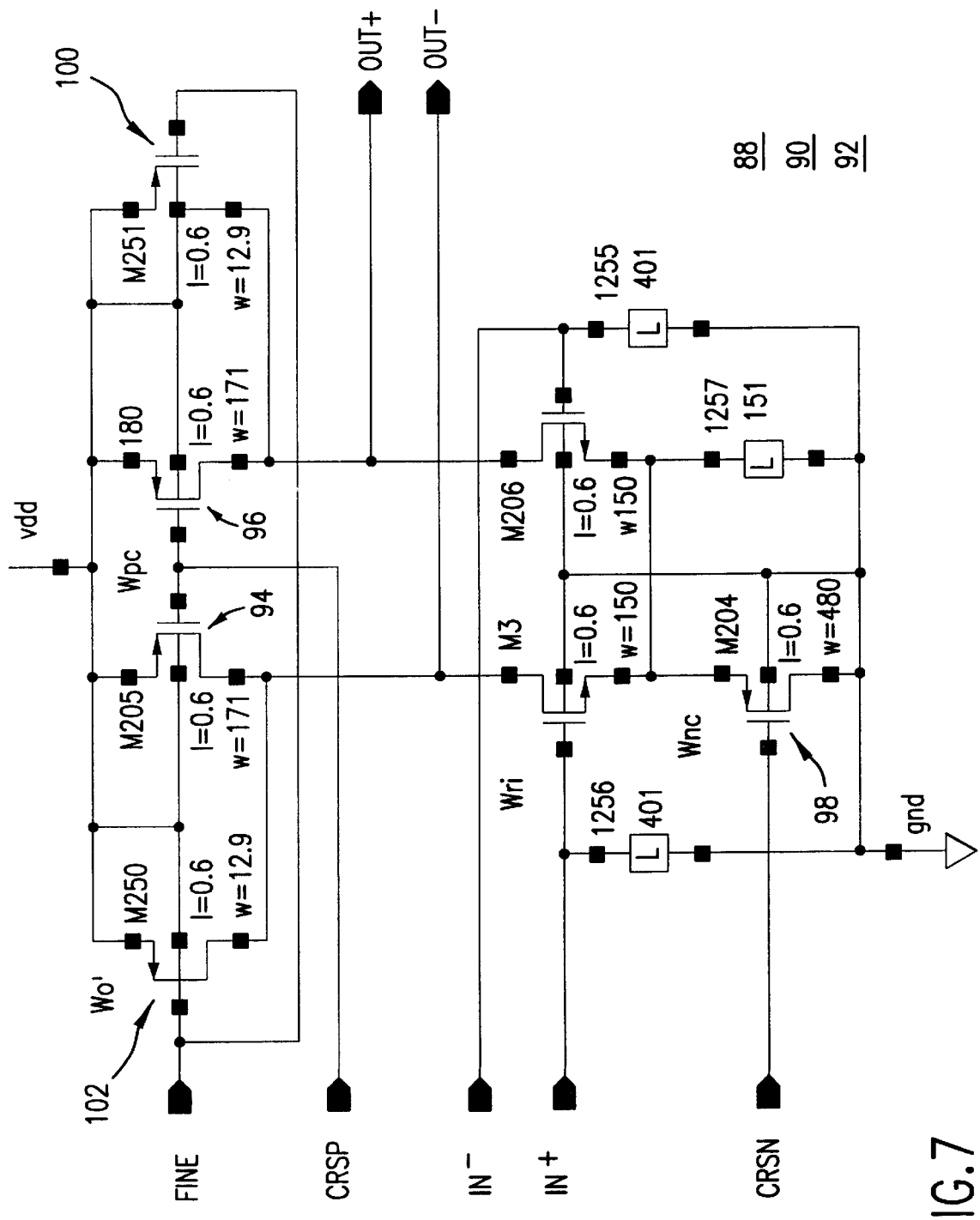
FIG. 7 is a schematic diagram of a differential amplifier useful in connection with the oscillator of FIG. 6.

Referring to FIG. 7, which is an integrated circuit embodiment of any one of amplifiers 88, 90 and 92 of voltage-controlled oscillator 76 of FIG. 6, each of the switching channels of the differential amplifier is connected to a high voltage source by two parallel connected transistors 94, 102 on the left channel and 96, 100 on the right channel. The surface dimensions of transistors 94, 96 are much larger than the surface dimensions of transistors 100, 102. Accordingly, control signals to transistors 94, 96 produce much higher current change and, hence, produce much higher variations in oscillation frequency than control signals to transistors 100, 102. Each of transistors 94, 96 are provided with a coarse control signal CRSP which comprises a DC signal output from a digital-to-analog converter. This signal is accordingly free of FM noise, for example, arising out of reference oscillator leakage in a phase-locked loop. A fine frequency control analog signal is provided to transistors 100, 102 which provide smaller variations in the supplied current, and consequently have a smaller effect on the delay time of the differential amplifier and, hence, produce smaller variations in oscillation frequency of the voltage-controlled oscillator 76. A third control signal CRSN is also digitally generated and is provided to transistor 98 connected to the current drain, to enable accommodation of coarse variations in the supplied current in the differential amplifier without adversely affecting the DC-biasing of the output signals OUT+ and OUT− over the entire tuning range of the voltage-controlled oscillator.

Figure 5:
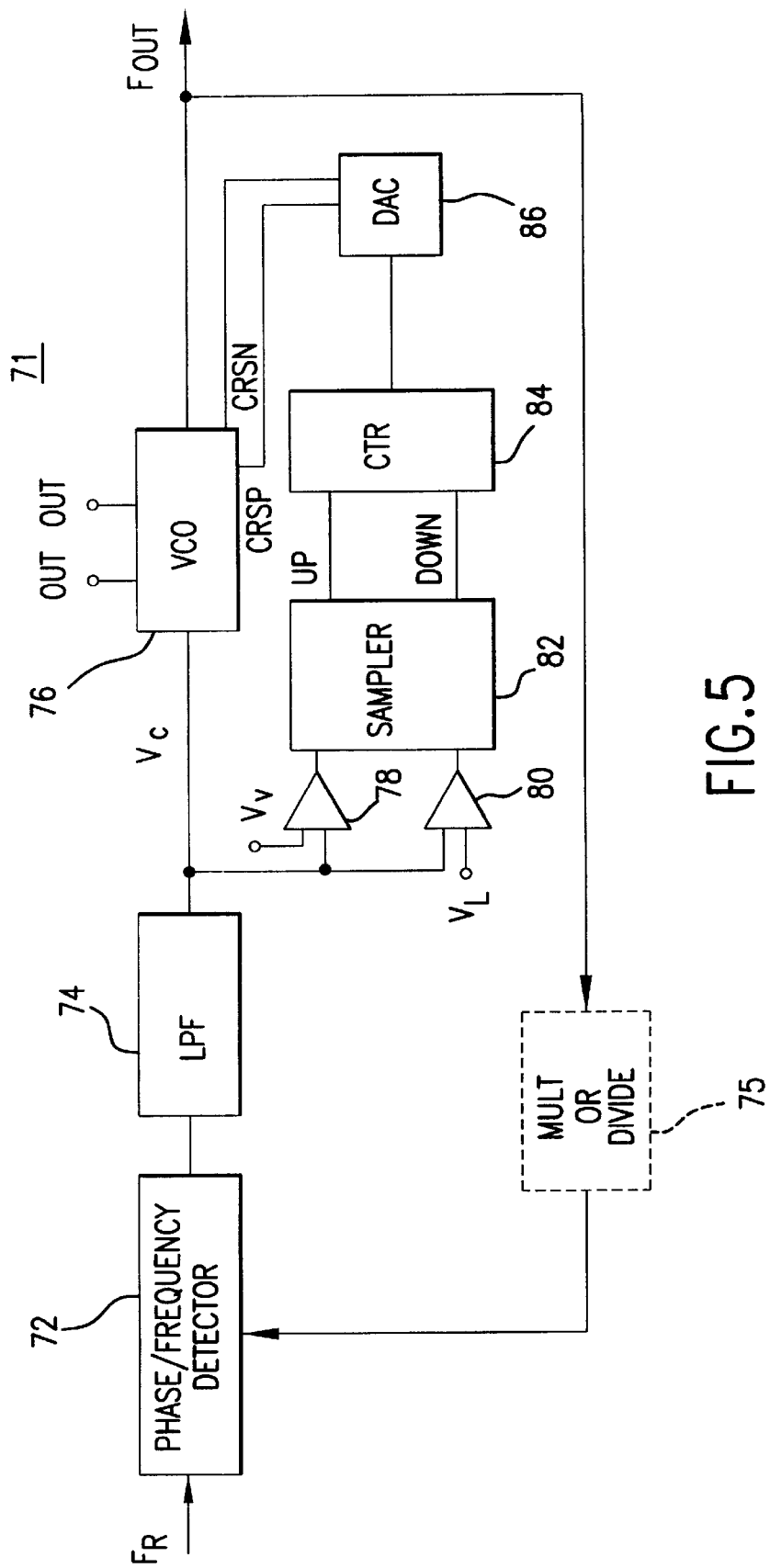
FIG. 5 is a block diagram showing a phase locked-loop useful in connection with the receiver of FIG. 4.

FIG. 5 is a block diagram of a phase locked loop 71 incorporating the differential ring oscillator 76. Phase locked loop 71 responds to a signal from a reference oscillator supplied to the phase-frequency detector 72. The output signal from the voltage-controlled oscillator 76 is supplied to the phase-frequency detector 72, usually through a frequency multiplier or frequency divider 75. In the case of an integrated circuit oscillator operating at 2.4 GHZ, divider 75 would usually divide the output from oscillator 76 to the frequency of the reference signal, and may comprise programmable dividers to enable stepped frequency variation to accommodate multi-channel signals. The output of the phase-frequency detector 72 comprises a phase-error signal which is filtered by low pass filter 74, in particular to suppress oscillations from the reference oscillator or divider 75 and to produce specified transient and steady-state loop responses. In a normal phase-locked loop, the filtered phase-error signal is provided to voltage-controlled oscillator 76 to vary the frequency thereof. In the phase-locked loop 71 of FIG. 5, the filtered phase-error signal is provided to voltage-controlled oscillator 76 as a fine frequency control signal, and additionally provided to comparators 78 and 80. Comparator 78 detects a variation of the phase-error signal above a high limit $V_H$ while comparator 80 detects variations below a lower limit $V_L$. The outputs of comparators 78 and 80 are sampled by circuit 82 to eliminate transient variations. Alternatively, a low-pass filter might be used. Counter 84 is counted up or down in response to detection of sustained filtered phase-error signals above or below the limits detected in comparators 78 and 80. Digital-to-analog converter 86 converts the value in counter 84 to first and second coarse control signals, possibly using different conversion scales, in order to provide the appropriate signals to transistors in voltage-controlled oscillator 76. The coarse control signals, CRSP and CRSN, are changed in discrete steps with changes in counter 84 and constitute fixed D.C. signals, which are independent of leakage through the phase-frequency detector 72 corresponding to oscillations of the reference oscillator or other sources. The filtered phase-error signal, provided to oscillator 76 as a fine frequency control analog signal, provides only minor corrections to the oscillator frequency until the phase-locked loop acquires phase-lock in the steady-state. Since the sensitivity of oscillator 76 to the fine frequency control signal is small, any unintended leakage of the reference oscillator signal through the phase-frequency detector 72 and low-pass filter 74 would cause the corresponding unwanted FM sidebands to be not as pronounced as they would otherwise be if the frequency control voltage must cover the entire wide tuning range of the voltage-controlled oscillator.

Figure 8:
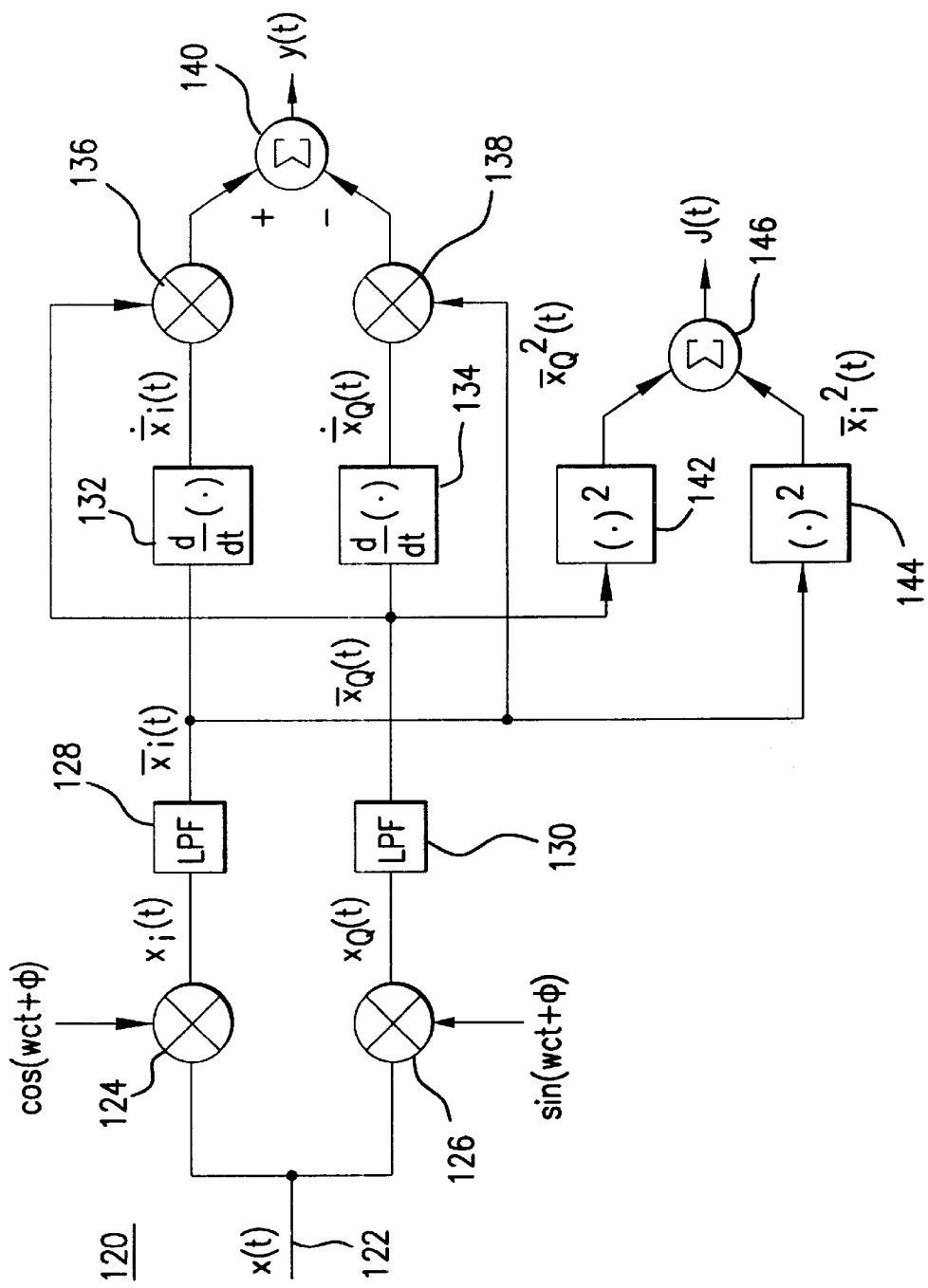
FIG. 8 is a block diagram showing a prior art FM receiver.
Figure 9:
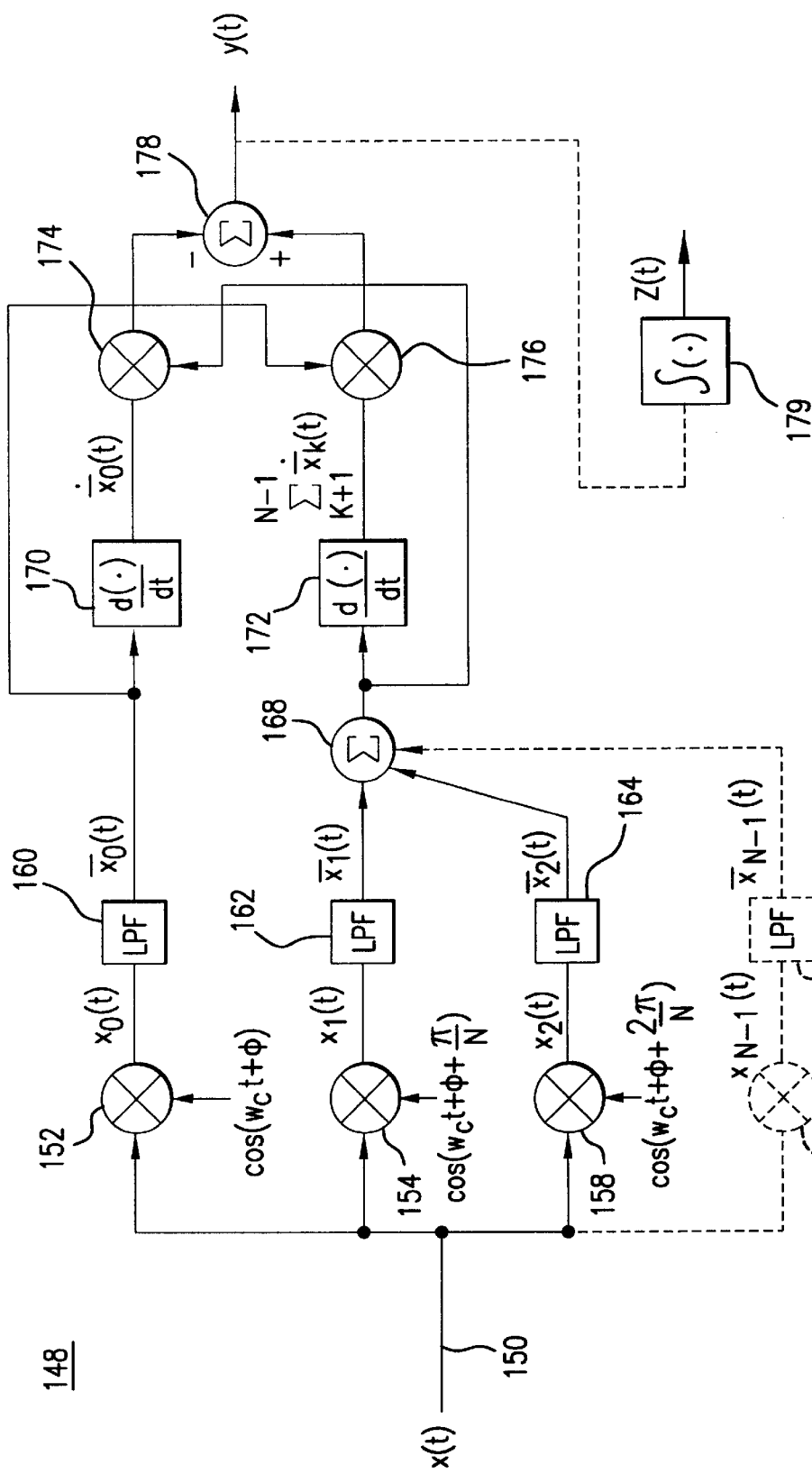
FIG. 9 is a block diagram showing a configuration of a multi-phase FM receiver, and alternatively a PM receiver, according to the present invention.

FIG. 9 is a block diagram depicting a multi-phase direct-conversion FM (or PM) receiver 148 in accordance with the present invention. In contrast to the receiver 120 shown in FIG. 8, wherein the local oscillator is provided with two orthogonal, quadrature phase components to mixers 124 and 126, receiver 148 includes mixers receiving three or more equally-phased local oscillator signals similar to the receiver depicted in FIG. 4.

As shown in FIG. 9, a modulated carrier signal, x(t), is provided on input line 150 and mixers 152, 154, 156 and 158 are provided with equally phased local oscillator signal components. N such mixers are provided with the phase between adjacent local oscillator components being separated by $\pi/N$ radians. The output signals from each of the mixers are provided to low pass filters 160, 162, 164 and 166. All but one of these intermediate signals are then summed in a combiner 168. This composite signal and the low-pass filtered intermediate signal produced from the remaining signal (shown in FIG. 9 as $\bar{x}_o(t)$) are then provided to differentiators 172 and 170, respectively. The differentiated output signals are cross-multiplied by the single intermediate and composite signals in mixers 174 and 176 and the mixer outputs are provided to combiner 178 to produce an output signal, y(t), which is representative of the demodulated frequency deviation. The differentiators (170, 172) and mixers (174, 176) may be combined into a discriminator device. In the event the original received signal is phase modulated, the phase deviation can be detected by integrating the frequency deviation output signal, y(t). Thus, integrator 179 may receive input signal y(t) and produce, at its output, the phase deviation output signal, z(t). As shown in FIG. 4 and the prior art receiver of FIG. 8, a second output signal representative of the constant instantaneous received energy J(t) can also be derived in the embodiment of FIG. 9 by taking the sum of the squares of each of the N low-pass filtered intermediate signals in the same fashion as that in FIG. 4.

Figure 10:
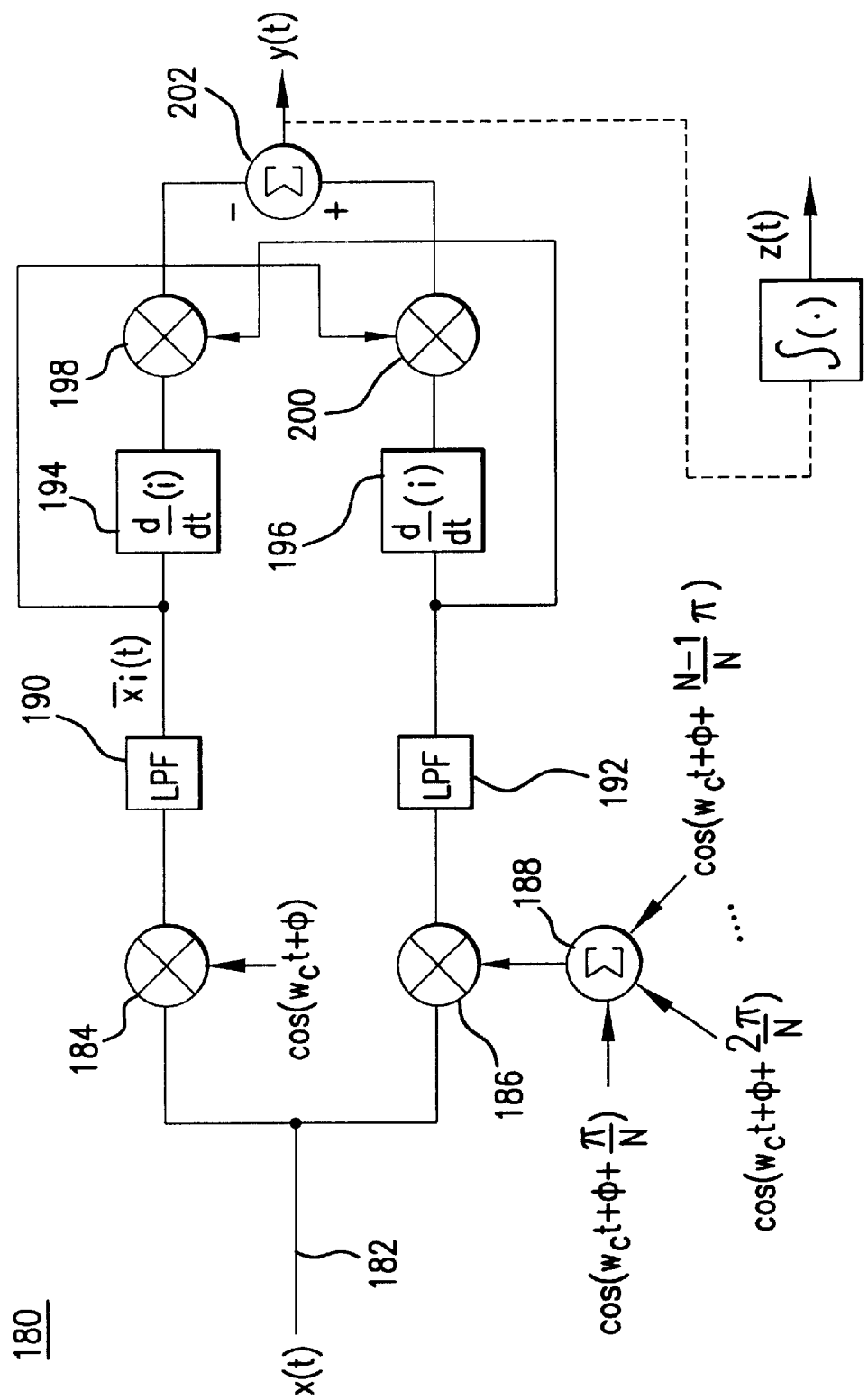
FIG. 10 is a block diagram showing another configuration of a multi-phase FM receiver, and alternatively a PM receiver, according to the present invention.

Finally, FIG. 10 illustrates another embodiment of a multiphase FM (or PM) receiver. In the receiver 180, modulated carrier signal, x(t), is provided on input line 182 to mixers 184 and 186. In this embodiment, N-1 equally phased (by $\pi/N$ radians) local oscillator signal components are provided to combiner 188. It can be shown mathematically that the remaining single oscillator signal component provided to mixer 184 is in quadrature phase with the signal component sum which is provided to mixer 186. The output signals from each of the mixers are then provided to low pass filters 190 and 192 and then to differentiators 194 and 196. The resulting differentiated outputs are cross-multiplied in mixers 198 and 200 by the quadrature-phase and in-phase components, respectively, of the low-pass filtered signal as shown in FIG. 10. The mixers' (198 and 200) outputs are finally summed in combiner 202 to produce an output signal, y(t), representative of the demodulated frequency deviation.

As described with regard to FIG. 9, it can be mathematically shown that integrating the frequency deviation output signal, y(t), over time results in a signal representing phase modulation (PM) in the received signal. Again as shown in FIG. 4 and the prior art receiver of FIG. 8, a second output signal representative of the constant instantaneous received energy J(t) can also be provided in the embodiment of FIG. 10 by taking the sum of the squares of each of the low-pass filtered intermediate signals in the same fashion as that in FIG. 4.

While the present invention has been described with respect to application in an integrated circuit receiver, those skilled in the art will recognize that aspects of the invention are useful in non integrated circuit applications and for providing RF signals in a transmitter circuit.

While there has been described what is believed to be the preferred embodiment of the invention, those skilled in the art will recognize that other and further modifications and changes may be made thereto without departing from the spirit of the invention, and it is intended to claim all such changes as fall within the true scope of the invention.

We claim:

1. A receiver for receiving an amplitude modulated signal, comprising a local oscillator comprising a ring oscillator having three amplifiers, and providing three equally phased output signal components, corresponding to the output of each of said amplifiers, three mixers, each for mixing one of said output signal components of said local oscillator with said amplitude modulated signal, three detectors, each for detecting the output signal of one of said mixers and a combiner for adding the output signals from said detector.

2. A receiver as specified in claim 1 wherein said output signal components are at a frequency above 1.9 GHz and wherein said ring oscillator comprises an integrated circuit.

3. A receiver as specified in claim 2 wherein said ring oscillator comprises a differential ring oscillator having at least three differential amplifiers, each responsive to at least one coarse frequency control signal and a fine frequency control signal.

4. A receiver as specified in claim 2 wherein each of said amplifiers comprises CMOS circuits.

5. A receiver as specified in claim 1 wherein said oscillator comprises a voltage-controlled oscillator.

6. A receiver as specified in claim 5 wherein said voltage-controlled oscillator is arranged as part of a phase-locked loop.

7. A receiver as specified in claim 6 wherein said phase-locked loop includes a phase-frequency detector providing a fine frequency control signal, wherein there are provided comparators for comparing said fine frequency control signal to first and second signal levels and a coarse frequency control signal generating circuit responsive to said comparators for providing at least one coarse frequency control signal to said voltage-controlled oscillator.

8. A receiver as specified in claim 7 wherein said coarse frequency control signal generating circuit comprises an up-down counter responsive to said comparators and a digital to analog converter responsive to said up-down counter.

9. A receiver as specified in claim 8 wherein said amplifiers of said voltage-controlled oscillator includes first and second current control devices for supplying current in said amplifiers, a first of said current control devices being responsive to signals from said coarse frequency control signal generating circuit, and a second of said current control devices being responsive to said fine frequency control signal.

10. A receiver as specified in claim 9 wherein said amplifier in said voltage-controlled oscillator includes a third current control device responsive to signals from said coarse frequency control signal generating circuit.

11. A receiver as specified in claim 10 wherein said coarse frequency control signal generating circuit comprises first and second D to A converters, responsive to said up-down counter for providing signals to said first and third current control devices.

12. A receiver as specified in claim 9 wherein said first and second current control devices comprise FETs, and wherein said first current control devices have a larger area than said second current control devices, said FETs being connected in parallel.

13. A receiver for receiving frequency modulated signals comprising a local oscillator having at least three equally phased components, a plurality of mixers, each for mixing one of said phase components of said local oscillator with a received signal, an adder for combining the outputs of all but one of said mixers and a discriminator responsive to the output of said one mixer and said adder for providing an output signal representative of frequency modulation.

14. A receiver as specified in claim 13 further comprising at least two energy detectors for deriving signals representing component signal energy and a combiner for deriving a signal representing received signal energy.

15. A receiver as specified in claim 13 wherein said discriminator comprises a first differentiator responsive to said one mixer output, a second differentiator responsive to said combiner output, a first mixer responsive to said first differentiator output and said combiner output, a second mixer responsive to said second differentiator output and said one mixer output and a second combiner for combining the output of said first and second mixers.

16. A receiver as specified in claim 15 further comprising at least two energy detectors for deriving signals representing component signal energy and a combiner for deriving a signal representing received signal energy.

17. A receiver for receiving phase modulated signals comprising the receiver of claim 13 and means for integrating said signal representative of frequency modulation to derive a signal representative of phase modulation.

18. A local oscillator providing first and second local oscillator signals in phase quadrature comprising an oscillator providing at least three equally-phased component signals and a combiner for combining all but one of said equally-phased component signals whereby the output of said combiner comprises a local oscillator signal in phase quadrature with said one component signal.

19. A receiver for receiving an amplitude modulated signal, comprising a local oscillator comprising a ring oscillator having N amplifiers, where N is an integer of 3 or greater, and providing N equally phased output signal components, corresponding to the output of each of said N amplifiers, N mixers, each for mixing one of said N output signal components with said amplitude modulated signal, N detectors, each for detecting the output signal of one of said mixers and a combiner for adding the N output signals from said detectors.

20. A method for receiving a signal amplitude modulated on a carrier having a frequency above 1.9 GHz, comprising:

providing a local oscillator comprising a ring oscillator having three amplifiers and providing a local oscillator signal having three equally phased signal components;

mixing each of said three signal components with said amplitude modulated carrier to provide three output signals;

detecting said output signals; and combining said detected output signals to provide said signal.

21. The method specified in claim 20 wherein said detecting step includes the step of calculating the squares of said output signals and said combining step comprises the step of summing the calculated squares.

22. A method for phase locking a ring oscillator, having a plurality of differential, voltage-controlled amplifiers arranged to respond to coarse and fine frequency control voltages, to a reference signal, comprising:

phase detecting a signal derived from the output of said ring oscillator with said reference signal to provide an analog phase error signal;

comparing said phase error signal to first and second reference signals and providing a first output pulse if said phase error signal exceeds said first reference signal and a second output pulse if said phase error signal is below said second reference signal;

applying said first and second output pulses to an up-down counter;

converting the digital count of said up-down counter to a coarse control voltage;

applying said coarse control voltage to said differential amplifiers as a coarse frequency control voltage; and applying said analog phase error signal to said differential amplifiers as a fine frequency control votage.

23. A phase locked loop comprising a voltage controlled oscillator, a phase detector for comparing a signal derived from said voltage controlled oscillator to a reference signal to provide an analog phase error signal, first and second signal comparators for comparing said phase error signal to first and second voltage levels and providing a first output pulse when said phase error signal exceeds said first voltage level and a second output pulse when said phase error signal is below said second voltage level, an up-down counter responsive to said first and second output pulses and a digital to analog converter for providing a coarse control voltage in response to the state of said up-down counter, wherein said voltage controlled oscillator is responsive to said coarse control voltage for providing coarse frequency adjustments and to said analog phase error signal for providing fine frequency adjustments.

* * * * *